United States Patent [19]

Wong et al.

[11] Patent Number: 5,666,320
[45] Date of Patent: Sep. 9, 1997

[54] STORAGE SYSTEM

[75] Inventors: Robert Chi-Foon Wong, Poughkeepsie; Taqi Nasser Buti, Millbrook; Seiki Ogura, Wappingers Falls, all of N.Y.

[73] Assignee: International Business Machines Corporation, Armonk, N.Y.

[21] Appl. No.: 575,428

[22] Filed: Dec. 20, 1995

[51] Int. Cl.$^6$ .................. G11C 11/00; G11C 7/00
[52] U.S. Cl. .................. 365/207; 365/205; 365/206; 365/210; 365/208; 365/196
[58] Field of Search .................. 365/190, 205, 365/149, 189.01; 307/530

[56] References Cited

U.S. PATENT DOCUMENTS

| | | | |
|---|---|---|---|
| 4,694,205 | 9/1987 | Shu et al. | 307/530 |
| 4,716,320 | 12/1987 | McAdams | 307/530 |
| 4,730,280 | 3/1988 | Aoyama | 365/205 |
| 4,816,706 | 3/1989 | Dhong et al. | 307/530 |
| 4,984,204 | 1/1991 | Sato et al. | 365/189 |
| 5,197,028 | 3/1993 | Nakai | 365/185 |
| 5,200,919 | 4/1993 | Kaya | 365/185 |
| 5,309,400 | 5/1994 | Akaogi | 365/189 |
| 5,331,597 | 7/1994 | Tanaka | 365/207 |
| 5,424,977 | 6/1995 | Rountree | 365/149 |
| 5,461,713 | 10/1995 | Pascucci | 365/190 |
| 5,475,642 | 12/1995 | Taylor | 365/203 |

OTHER PUBLICATIONS

Shohji, K. et al., Novel Automatic Erase Technique Using An Internal Voltage Generator For 1MBit Flash EEPROM, Jun. 7, 1990, Symposium on VLSI Circuits, Digest of Technical Papers, pp. 99–100.

Baker, A. et al., 3.3V 16Mb Flash Memory With Advanced Write Automation, Feb. 1994, IEEE International Solid State Circuits Conference, pp. 146–147.

Kuo, C. et al., 512-kb Flash EEPROM embedded in an 32-b Microcontroller, Apr. 1992, IEEE J. of Solid State Circuits, pp. 574–582.

Primary Examiner—Viet Q. Nguyen
Attorney, Agent, or Firm—Donald D. Mondul; Susan M. Murray

[57] ABSTRACT

An improved storage system for use with computers. The system includes a memory array bifurcated into a first and second array segment and a differential sense amplifier configured for selective operation in a first mode establishing one array segment as a reference load and the other array segment as a dynamic load, and a second mode establishing the other array segment as a reference load and the one array segment as a dynamic load. The amplifier senses changes in a parameter in the dynamic load with respect to the reference load.

3 Claims, 2 Drawing Sheets

STORAGE SYSTEM

BACKGROUND OF THE INVENTION

The present invention is directed to an improved storage system for use with computing devices, especially differential sense amplifiers. Differential amplifiers are widely used in memory sensing circuitry accessing. In particular, the present invention is directed to a storage system using a differential sense amplifier for accessing information within a memory array in the system, the storage system having improved stability in its response in the presence of varying ambient conditions, such as temperature and manufacturing variations of components.

In computer storage systems much design effort has been expended in optimizing tracking between the bit line to be sensed in a memory array and a dummy bit line providing a reference voltage to a differential sense amplifier. Elaborate techniques, such as dummy flash cells or the like, have been employed to establish a dummy bit line providing a stable reference voltage between the logical "0" signal level and the logical "1" signal level of a digital circuit in which the differential amplifier and its associated memory array are employed. Various devices have been employed to mimic a true cell as a dummy reference cell supplying a dummy bit line in a differential memory sensing circuit. However, ambient conditions and electrical conditions affect the dummy cell components and the memory array differently; the dummy bit line, and the bit line to be measured in comparison to the dummy bit line to indicate the contents of the memory array, do not respond to those conditions equally. Inaccurate indications of the contents of the memory array may result.

SUMMARY OF THE INVENTION

An improved storage system for use with computing devices includes an array of storage elements for storing information, a plurality of store access lines for selectively storing the information in particular storage elements, a plurality of read access lines for selectively conveying stored information from identified storage elements, and a plurality of sensing devices coupled with the read access lines for sensing stored information. Each sensing device is configured for sensing differences in a predetermined parameter at a first locus and a second locus. The first locus is coupled with a first signal source and the second locus is coupled with a second signal source. The sensing is effected by a first sensing element coupled with the first locus and a second sensing element coupled with the second locus. The improvement comprises the memory array being bifurcated into a first memory array segment and a second memory array segment; the first locus is coupled with the first memory array segment, and the second locus is coupled with the second memory array segment. The sensing is effected by a first sensing element coupled with the first locus and a second sensing element coupled with the second locus. The differential sense amplifier is configured for selective operation in at least two modes: a first mode establishes one memory array segment of the first memory array segment and the second memory array segment as a reference load and establishing the other memory array segment as a dynamic load; a second mode establishes the other memory array segment as a reference load and establishes the one memory array segment as a dynamic load. The amplifier senses changes in the parameter in the dynamic load with respect to the reference load.

It is, therefore, an object of the present invention to provide an improved storage system for use with a computing device having accurate tracking of reference versus sensed voltages in sensing memory circuitry.

Further objects and features of the present invention will be apparent from the following specification and claims when considered in connection with the accompanying drawings illustrating the preferred embodiment of the invention.

DETAILED DESCRIPTION OF THE INVENTION

Figure 1:
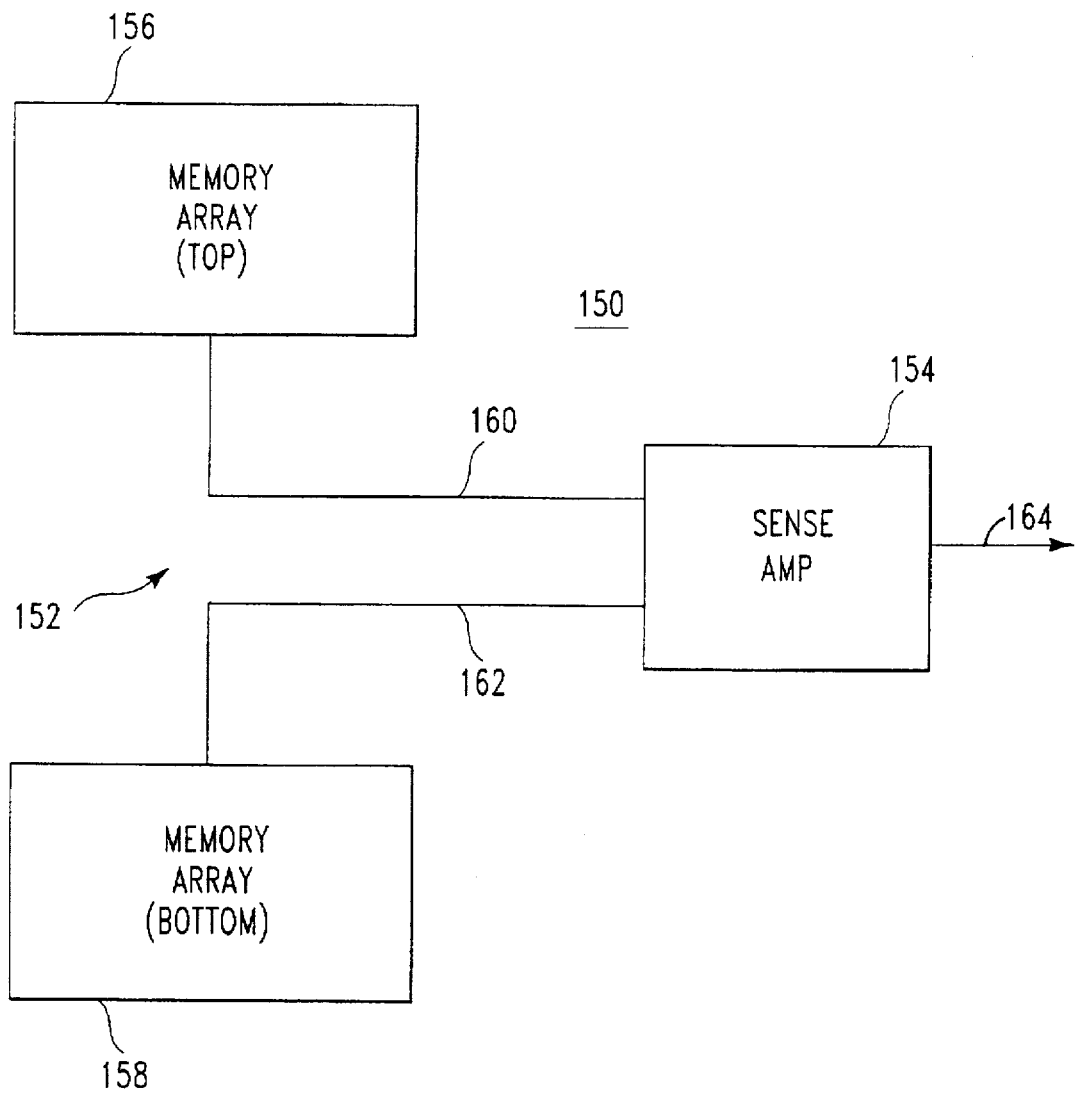
FIG. 1 is a schematic block diagram of a storage system including a bifurcated memory array and a differential sense amplifier.

FIG. 1 is a schematic block diagram of a storage system including a bifurcated memory array and a differential sense amplifier. In FIG. 1, a storage system 150 includes a memory array 152 and a differential sense amplifier 154. Memory array 152 is comprised of a top memory array segment 156 and a bottom memory array segment 158. Top memory array segment 156 is coupled with differential sense amplifier 154 via a line 160; bottom memory array segment 158 is coupled with differential sense amplifier 154 via a line 162. Differential sense amplifier 154 generates an output at an output terminal 164. Preferably differential sense amplifier 154 cooperates with memory array 152 so that in a first mode of operation top memory array segment 156 is regarded by differential sense amplifier 154 as the dynamic signal source evaluated at a dynamic sense node (not shown in FIG. 1) and bottom memory array segment 158 is regarded by differential sense amplifier 154 as a reference signal source evaluated at a reference sense node (not shown in FIG. 1). Differential sense amplifier 154 further cooperates with memory array 152 so that in a second mode of operation top memory array segment 156 is regarded by differential sense amplifier 154 as the reference signal source evaluated at a reference sense node (not shown in FIG. 1) and bottom memory array segment 158 is regarded by differential sense amplifier 154 as a dynamic signal source evaluated at a dynamic sense node (not shown in FIG. 1). In such manner, the respective reference signal and dynamic signal for a given evaluation in either the first mode of operation or the second mode of operation will more accurately track together. That is, since each of the lines 160, 162 are coupled with similarly configured circuitry, rather than one of the lines being coupled with a dummy, or simulated, representation of the other circuit, the two signals provided by lines 160, 162 will substantially reflect the same reactions to ambient and electrical conditions.

In order to facilitate understanding the invention, like elements will be identified by like reference numerals in the various drawings.

Figure 2:
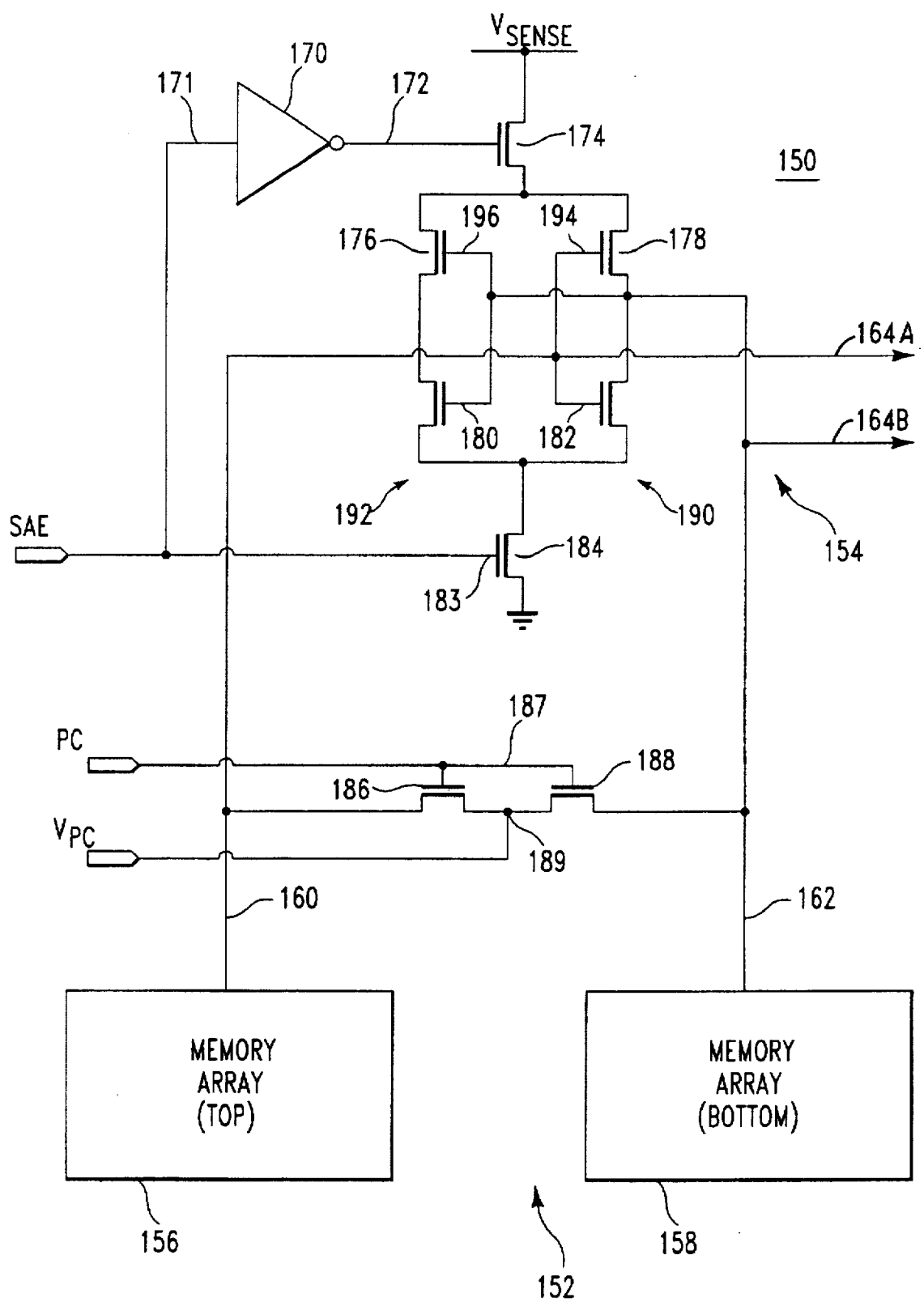
FIG. 2 is an electrical schematic diagram of the preferred embodiment of the present invention differential sense amplifier employed in the storage system of FIG. 1.

FIG. 2 is an electrical schematic diagram of the preferred embodiment of the present invention differential sense amplifier employed in the storage system of FIG. 1. In FIG. 2, storage system 150 including memory array 152 and differential sense amplifier 154 are illustrated in further detail. Memory array 152 includes top memory array segment 156 coupled with differential sense amplifier 154 via line 160, and includes bottom memory array segment 158 coupled with differential sense amplifier 154 via line 162. Differential sense amplifier 154 includes PFETs 174, 176, 178, NFETs 180, 182, 184, 186, 188, and inverter 170. Differential sense amplifier 154 has a top side including PFET 178 and NFET 182, and a bottom side including PFET 176 and NFET 180. The sense amplifier is unbalanced with NFET 180 being about half the width of NFET 182. An alternative unbalance scheme is to apply a bias current on the reference side when the sense amp. is enabled.

A sense amplifier enable signal (SAE) is applied to the gate 183 of NFET 184 and to the input 171 of inverter 170. Thus, the signal appearing at node 172 is the inverse of the SAE signal. A precharging signal (PC) is applied via line 187 to NFETs 186, 188; a precharging voltage signal $V_{PC}$ is applied to node 189 intermediate NFETs 186, 188. During precharging, the PC signal is HIGH so that NFETs 186, 188 are gated to apply $V_{PC}$ to lines 160, 162. Also during precharging, the SAE signal is LOW, so NFET 184 is not gated. The signal at node 172 is HIGH, so PFET is not gated. In such manner top sense node 194 and bottom sense node 196 are precharged to $V_{PC}$.

During evaluation operations, the SAE signal is HIGH so that NFET 184 is gated, and the signal at node 172 is LOW so that PFET is gated. The PC signal is LOW so that NFETs 186, 188 are not gated. As mentioned earlier, storage system operates in two modes wherein the top and bottom memory arrays 156, 158 are alternately regarded as dynamic or reference signal sources. For purposes of understanding the operation of storage system 150, presume now that top memory array segment 156 is the dynamic signal source and bottom memory array segment 158 is the reference signal source. Given such a configuration, or mode, of operation during evaluation, when both top memory array segment 156 and bottom memory array segment 158 are placing a logical "1" on lines 160, 162, PFETS 176, NFET 182 are gated on, PFET 178, NFET 180 are gated off, and output 164B is at "0". When top memory array segment 156 places a logical "0" on line 160 (recall that bottom memory array segment 158 is regarded as the reference signal source, so the signal on line 162 remains a logical complement of line 160), PFET 176 and NFET 182 are gated off, PFET 178 and NFET 180 are gated on, and output 164B is at logical "1". Output 164A is a logical complement of output 164B in all cases in this mode of operation.

When storage system 150 is configured to operate in the alternate mode wherein bottom memory array segment 158 is regarded by differential sense amplifier 154 as the dynamic signal source and top memory array segment 156 is regarded as the reference signal source, the mirror opposite gatings and output signals occur; indicating outputs occur at output 164A, and output 164B is ever a logical complement of output 164A. Please note that the unbalance bias must be reversed accordingly.

It is to be understood that, while the detailed drawings and specific examples given describe preferred embodiments of the invention, they are for the purpose of illustration only, that the structure and method of the invention are not limited to the precise details and conditions disclosed, and that various changes may be made therein without departing from the spirit of the invention which is defined by the following claims.

We claim:

1. An improved differential sense amplifier for sensing differences in a predetermined parameter at a first node and a second node; said first node being coupled with a first storage array; said second node being coupled with a second storage array; said sensing being effected by a first sensing element coupled with said first node and a second sensing element coupled with said second node the improvement comprising:

the differential sense amplifier being configured for selective operation in at least two modes; a first mode of said at least two modes establishing said first storage array as a reference load and establishing said second storage array as a dynamic load; a second mode of said at least two modes establishing said second storage array as a reference load and establishing said first storage array as a dynamic load; the amplifier sensing changes in said predetermined parameter in said dynamic load with respect to said reference load.

2. An improved differential sense amplifier for sensing differences in a predetermined parameter as recited in claim 1 wherein said first sensing element is a first field effect transistor and said second sensing element is a second field effect transistor.

3. An improved differential sense amplifier for sensing differences in a predetermined parameter as recited in claim 2 wherein said sensing in said first field effect transistor and said second field effect transistor is established by a threshold voltage characteristic for each of said first sensing element and said second sensing element.

* * * * *